(12) United States Patent
Sugiyama (10) Patent No.: US 10,218,148 B2
(45) Date of Patent: Feb. 26, 2019

(54) LIGHT EMITTING DEVICE

(71) Applicant: NICHIA CORPORATION, Anan-shi (JP)

(72) Inventor: Takafumi Sugiyama, Yoshinogawa (JP)

(73) Assignee: NICHIA CORPORATION, Anan-Shi (JP)

( * ) Notice: Subject to any disclaimer, the term of this patent is extended or adjusted under 35 U.S.C. 154(b) by 92 days.

(21) Appl. No.: 14/680,884

(22) Filed: Apr. 7, 2015

(65) Prior Publication Data

US 2015/0292687 A1 Oct. 15, 2015

(30) Foreign Application Priority Data

Apr. 9, 2014 (JP) .................................. 2014-080595
Jan. 29, 2015 (JP) .................................. 2015-014905

(51) Int. Cl.
*G02B 27/20* (2006.01)
*H01S 5/00* (2006.01)
(Continued)

(52) U.S. Cl.
CPC .............. *H01S 5/0078* (2013.01); *F21K 9/64* (2016.08); *H01S 5/02212* (2013.01);
(Continued)

(58) Field of Classification Search
CPC ..... F21K 9/56; F21K 9/64; F21K 9/20; G03B 2215/0567; G03B 21/2033; H01S 5/0078; H01S 5/02212; H01S 5/02296; H01S 3/005; H01S 3/04; H01S 5/005; H01S 5/02288; H01S 5/02469; H01S 5/02236; F21Y 2115/30; F21Y 2101/00; F21Y 2101/05; H01L 33/50; H01L 2224/48091; H01L 2924/00014; H01L 33/62; G02B 6/42;
(Continued)

(56) References Cited

U.S. PATENT DOCUMENTS

2008/0116473 A1   5/2008   Sugiyama
2009/0261708 A1   10/2009  Moseri et al.
(Continued)

FOREIGN PATENT DOCUMENTS

CN   201462686 U   5/2010
JP   2008-153617 A   7/2008
(Continued)

*Primary Examiner* — Evan Dzierzynski
*Assistant Examiner* — Omar Rojas Cadima
(74) *Attorney, Agent, or Firm* — Foley & Lardner LLP (57) ABSTRACT

A light emitting device includes a semiconductor laser element; a cap defining a through-hole allowing light from the semiconductor laser element to pass therethrough; and a wavelength converting member disposed in the through-hole defined in the cap, the wavelength converting member being configured to emit light that has a wavelength different from a wavelength of light from the semiconductor laser element. The cap includes a first member made of a ceramic, and a second member made of a metal material. The through-hole includes a first through-hole penetrating the first member, and a second through-hole penetrating the second member. The wavelength converting member is disposed on the second member.

21 Claims, 7 Drawing Sheets

(51) Int. Cl.
*H01S 5/022* (2006.01)
*F21K 9/64* (2016.01)
*F21K 9/20* (2016.01)
*F21Y 115/30* (2016.01)
*F21Y 115/10* (2016.01)

(52) U.S. Cl.
CPC ............ *H01S 5/02296* (2013.01); *F21K 9/20* (2016.08); *F21Y 2115/10* (2016.08); *F21Y 2115/30* (2016.08); *H01L 2224/48091* (2013.01)

(58) Field of Classification Search
CPC .......................... G02B 6/29361; G02B 6/2937; G02B 6/2938; G02B 6/4215; G02B 6/4226; G02B 6/4292; G02B 6/4207; G02B 6/4206
USPC ...................................... 362/259, 84
See application file for complete search history.

(56) References Cited

U.S. PATENT DOCUMENTS

| | | | |
|---|---|---|---|
| 2013/0107573 A1 | 5/2013 | Kadomi et al. | |
| 2013/0119852 A1* | 5/2013 | Tanida | H01L 33/60 313/113 |
| 2013/0250544 A1 | 9/2013 | Zink et al. | |
| 2013/0334559 A1* | 12/2013 | Vdovin | H01L 33/507 257/98 |
| 2014/0085923 A1 | 3/2014 | Nakazato | |
| 2014/0160782 A1* | 6/2014 | Harada | F21S 48/1145 362/538 |
| 2016/0190418 A1* | 6/2016 | Inomata | H01L 33/507 257/98 |

FOREIGN PATENT DOCUMENTS

| | | | | |
|---|---|---|---|---|
| JP | 2008-235744 A | 10/2008 | | |
| JP | 2009-260053 A | 11/2009 | | |
| JP | 2009-272576 | 11/2009 | | |
| JP | 2010-199357 A | 9/2010 | | |
| JP | 2011-014587 A | 1/2011 | | |
| JP | 05-228412 B2 | 7/2013 | | |
| JP | 05-347231 B2 | 11/2013 | | |
| JP | WO 2013179732 A1 * | 12/2013 | ........... A61B 1/0653 | |
| JP | 2014-022650 | 2/2014 | | |
| JP | 2014-112707 A | 6/2014 | | |
| JP | 2014-160555 A | 9/2014 | | |

* cited by examiner

LIGHT EMITTING DEVICE

CROSS-REFERENCE TO RELATED APPLICATION

This application claims priority to Japanese Patent Application No. 2014-080595 filed on Apr. 9, 2014 and Japanese Patent Application No. 2015-014905, filed on Jan. 29, 2015. The entire disclosure of Japanese Patent Application No. 2014-080595 and No. 2015-014905 are hereby incorporated herein by reference.

BACKGROUND

Technical Field

The present disclosure relates to a light emitting device.

Description of Related Art

There has been proposed a semiconductor light emitting device in which a light-transmissive body that contains a wavelength converting material is disposed in a through-hole defined in a cap body which covers a semiconductor light emitting element, for example, in JP 2008-153617A.

A light emitting device that is superior in the stability of its optical characteristics and in heat dissipation performance compared to those described above can be provided.

SUMMARY

A light emitting device includes a semiconductor laser element, a cap that defines a through-hole that allows light from the semiconductor laser element to pass through, and a wavelength converting member disposed in the through-hole to emit light that has a wavelength different from the wavelength of light from the semiconductor laser element. The cap includes a first member made of a ceramic, and a second member made of a metal material. The through-hole includes a first through-hole defined by penetrating a first member and a second through-hole defined by penetrating a second member. The wavelength converting member is disposed on the second member.

A light emitting device having good stability in its optical characteristics and good heat dissipation can be provided.

BRIEF DESCRIPTION OF THE DRAWINGS

FIGS. 1A and 1B are schematic cross-sectional views of a light emitting device according to Embodiment 1 with a configuration in which a lower surface of a wavelength converting member is in contact with a second member, where FIG. 1A is an overall cross-sectional view.

FIGS. 2A and 2B are schematic cross-sectional views of a light emitting device according to Embodiment 1 with a configuration in which a metal member is arranged between a lower surface of a wavelength converting member and a second member, where FIG. 2A is an overall cross-sectional view.

FIGS. 3A and 3B are schematic cross-sectional views of a light emitting device according to Embodiment 1 with a configuration in which side surfaces of a wavelength converting member are spaced apart from a first member, where FIG. 3A is an overall cross-sectional view.

FIGS. 4A and 4B are schematic cross-sectional views of a light emitting device according to Embodiment 2 with a configuration in which side surfaces of a wavelength converting member are in contact with a second member, where FIG. 4A is an overall cross-sectional view.

FIGS. 5A and 5B are schematic cross-sectional views of a light emitting device according to Embodiment 2 with a configuration in which a metal member is arranged between each side surface of a wavelength converting member and a second member, where FIG. 5A is an overall cross-sectional view.

FIGS. 6A and 6B are schematic plan views each showing an example of a shape defining a through-hole, where

FIGS. 7A and 7B are schematic cross-sectional views of a light emitting device according to Embodiment 2 with a configuration in which a wavelength converting member has a multilayer structure, where FIG. 7A is an overall cross-sectional view.

DETAILED DESCRIPTION OF REPRESENTATIVE EMBODIMENTS

Light Emitting Device 100 According to Embodiment 1

As shown in FIGS. 1A to 3B, a light emitting device 100 according to Embodiment 1 includes a semiconductor laser element 10, a cap 30 defining a through-hole 30a allowing light from the semiconductor laser element 10 to pass through, and a wavelength converting member 40 disposed in the through-hole 30a to emit light which has a wavelength different from wavelength of light from the semiconductor laser element 10. The cap 30 includes a first member 31 made of a ceramic, and a second member 32 made of a metal material. The through-hole includes a first through-hole 31a penetrating a first member 31 and a second through-hole 32a penetrating a second member 32. The wavelength converting member 40 is disposed on the second member 32.

(Semiconductor Laser Element 10)

For the semiconductor laser element 10, a laser diode or the like can be used. As for the laser diode, for example, a laser diode having an emission peak wavelength in a range of 300 nm to 600 nm, preferably in a range of 420 nm to 470 nm, can be used. In the case of using a laser diode having an emission peak wavelength in a range of 300 nm to 600 nm as the semiconductor laser element 10, for example, with the use of aluminum oxide ($Al_2O_3$) as the ceramic and copper as the metal material, the ceramic can have a higher reflectance than the metal material. Further, in the case of using a laser element having an emission peak wavelength in a range of 420 nm to 470 nm for the semiconductor laser element 10, in addition to exhibiting similar effects as in the use of a laser diode having an emission peak wavelength in a range of 300 nm to 600 nm, a YAG-based fluorescent material or the like can be used as a wavelength converting member 40 so that light from the semiconductor laser element 10 (for example, a blue light, a purple light, or the like) and light from the wavelength converting member 40 (for example, a YAG-based fluorescent material) can be combined; thus, a white light can be extracted easily.

The semiconductor laser element 10 is disposed on a heat sink 20. For the heat sink 20, a member having good thermal conductive property, for example, copper, aluminum, brass, or the like, is preferably used. The heat sink 20 is fixed on a plate-shaped stem 21. The semiconductor laser element is connected to leads 22 via an electrically conductive member such as wires.

(Cap 30)

Figure 6A:
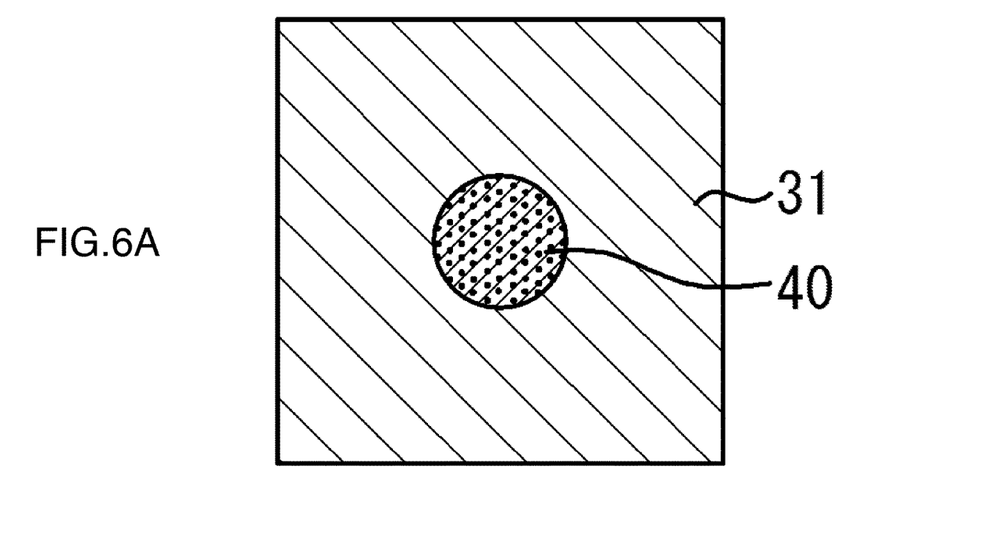
FIG. 6A shows an example of a shape defining a through-hole being a circular shape in a plan view.
Figure 6B:
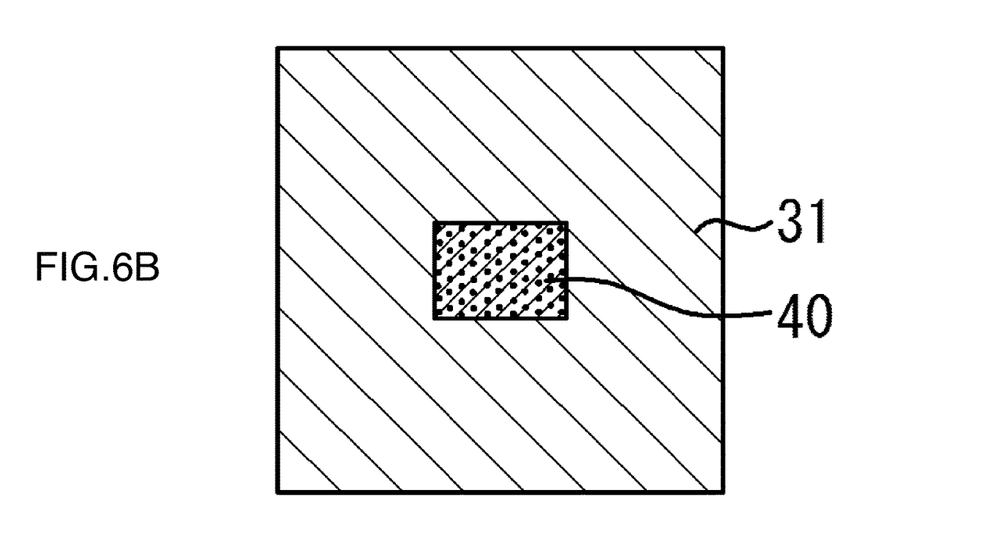
FIG. 6B shows an example of a shape defining a through-hole being a rectangular shape in a plan view.

The cap 30 is disposed over the semiconductor laser element 10 so as to cover the semiconductor laser element 10, and defines a through-hole 30a to allow light from the semiconductor laser element 10 to pass therethrough. Light emitted from the semiconductor laser element 10 passes through the through-hole 30a defined in the cap 30 and is extracted to the outside. The shape that defines the through-hole 30a is not specifically limited, and for example, as shown in FIG. 6A or FIG. 6B, a circular shape, a rectangular shape, or the like in a plan view can be employed. By way of example, this description may be given in singular pertaining to the inner wall surface which defines a single through-hole 30a (inner wall surface defining the first through-hole 31a and inner wall surface defining the second through-hole 32a), but as indicated above, the description is inclusive of and extensive enough to cover a multiple number of inner wall surfaces which define a single through-hole 30a.

The cap 30 includes a first member 31 made of a ceramic and a second member 32 made of a metal material. With the use of the first member 31 made of a ceramic, a reduction in the reflectance due to oxidation, sulfurization, or the like, can be suppressed and stable optical characteristics can be obtained. Also, with the use of the second member 32 made of a metal material, heat generated by the wavelength converting member 40 can be efficiently dissipated to the outside. The first member 31 and the second member 32 may have a multilayer structure.

Examples of the ceramic include aluminum oxide ($Al_2O_3$), titanium oxide ($TiO_2$), zirconium oxide ($ZrO_2$), or the like, can be used. Examples of the metal material include a material which has a thermal conductivity of 100 $W \cdot m^{-1} \cdot K^{-1}$ or greater (e.g., copper, aluminum, or brass) can be used. In the first member 31, a material other than a ceramic may be contained to the extent that the first member 31 can be regarded as being substantially made only of a ceramic. In a similar manner, in the second member 32, a material other than a metal material may be contained to the extent that the first member 31 can be regarded as being substantially made only of a metal material.

The reflectance of the ceramic to light from the semiconductor laser element 10 may be smaller than the reflectance of the metal material, but a higher reflectance than the metal material is preferable. For example, the reflectance of the ceramic to the light from the semiconductor laser element 10 with respect to the reflectance of the metal material to the light from the semiconductor laser element 10 may be preferably 160% or greater, more preferably 170% or greater, and further preferably 180% or greater. The reflectance of the ceramic to the light from the semiconductor laser element 10 is 70% or greater, preferably 80% or greater, and more preferably 90% or greater.

The through-hole 30a includes a first through-hole 31a which penetrates the first member 31 and a second through-hole 32a which penetrates the second member 32. The shapes defining the first through-hole 31a and the second through-hole 32a are not specifically limited, but for example, it is preferable that the second member 32 is arranged closer to the semiconductor laser element 10 than the first member 31 is to the semiconductor laser element 10, and the opening diameter of the second through-hole 32a is smaller than the opening diameter of the first through-hole 31a. With this arrangement, the inner wall surfaces which define the second through-hole 32a locate inner side than the inner wall surfaces which define the first through-hole 31a in the through-hole 30a, which allows the second member 32 to protrude in the through-hole 30a. Thus, the lower surface of the wavelength converting member 40 can be supported by the upper surface of the second member 32. Accordingly, placement of the wavelength converting member 40 in the through-hole 30a can be facilitated, and also, the wavelength converting member 40 can be in contact with the second member 32 with a relatively large contact dimension. The lower surface of the wavelength converting member 40 can be supported directly by the upper surface of the second member 32 (see FIGS. 1A and 1B, and FIGS. 3A and 3B), or can be supported via the metal member 50 (see FIGS. 2A and 2B). For the metal member 50, for example, a eutectic bonding material such as Au—Sn can be used. With the use of such a material for the metal member 50, the wavelength converting member 40 and the second member 32 can be bonded without compromising the heat dissipation performance.

Figure 1A:
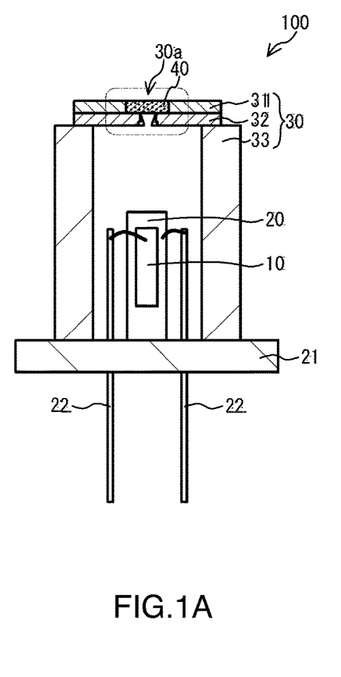
Figure 1B:
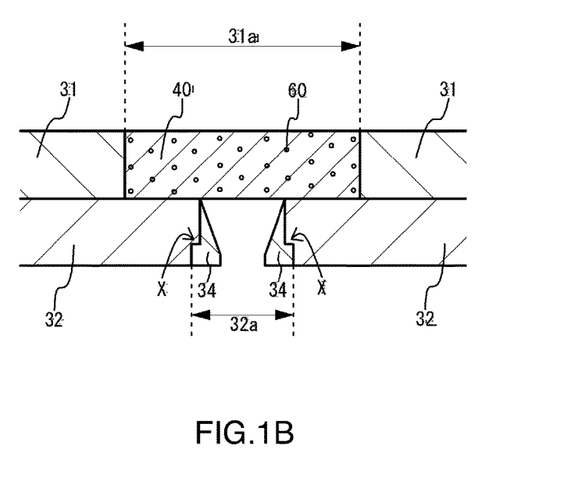
FIG. 1B is an enlarged cross-sectional view of a part enclosed by the dash-dot line in FIG. 1A.
Figure 2A:
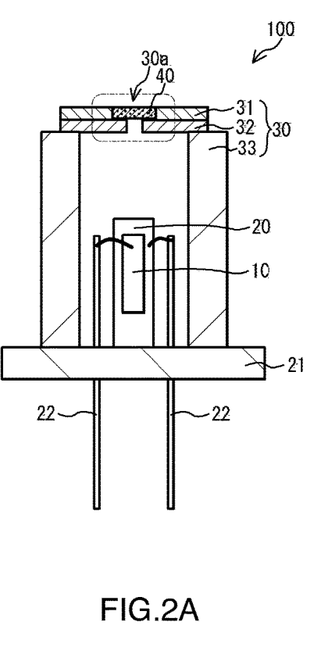
Figure 2B:
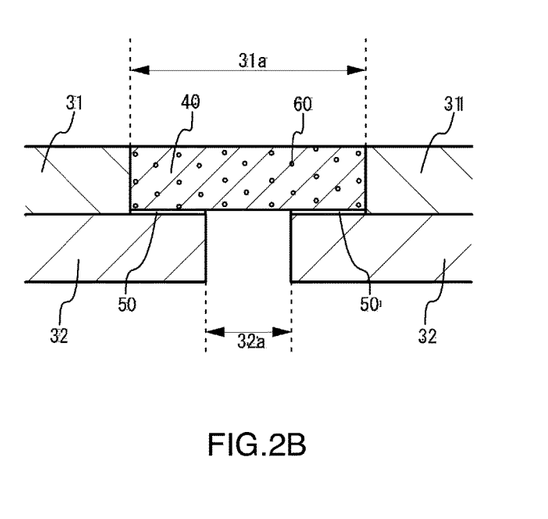
FIG. 2B is an enlarged cross-sectional view of a part enclosed by the dash-dot line in FIG. 2A.
Figure 3A:
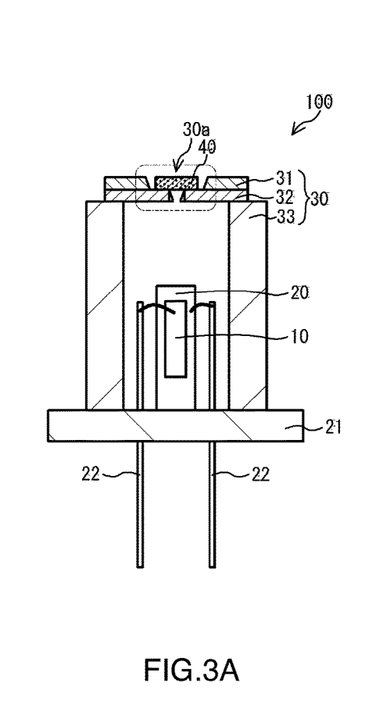
Figure 3B:
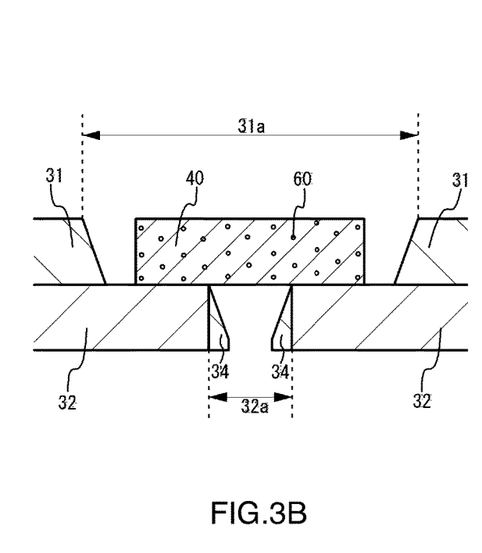
FIG. 3B is an enlarged cross-sectional view of a part enclosed by the dash-dot line in FIG. 3A.
Figure 4A:
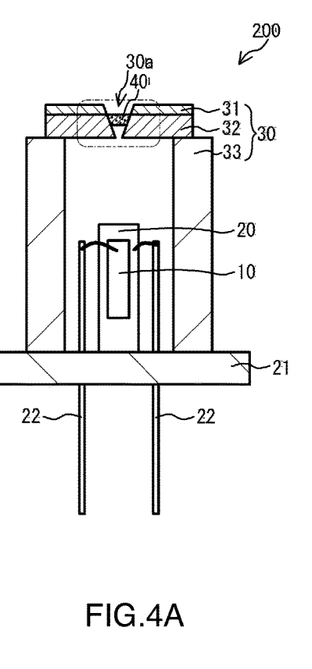
Figure 4B:
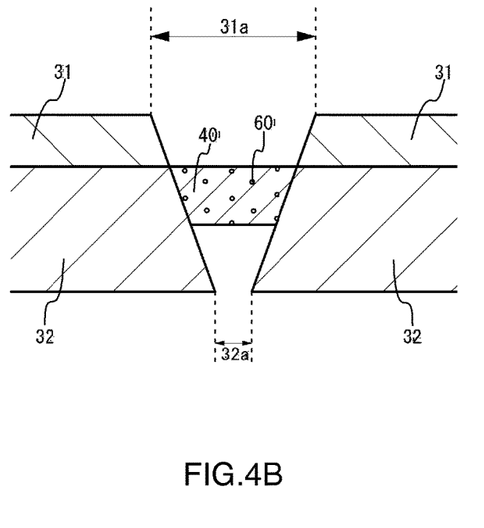
FIG. 4B is an enlarged cross-sectional view of a part enclosed by the dash-dot line in FIG. 4A.
Figure 5A:
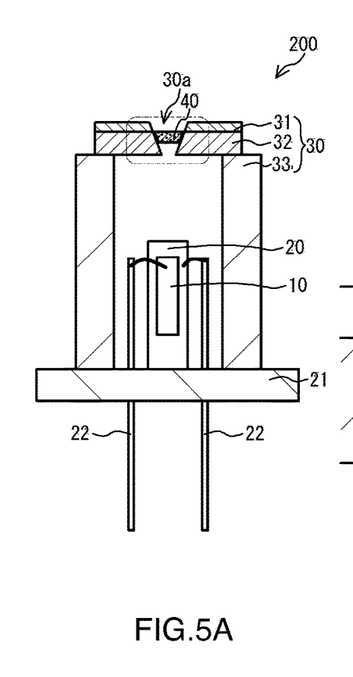
Figure 5B:
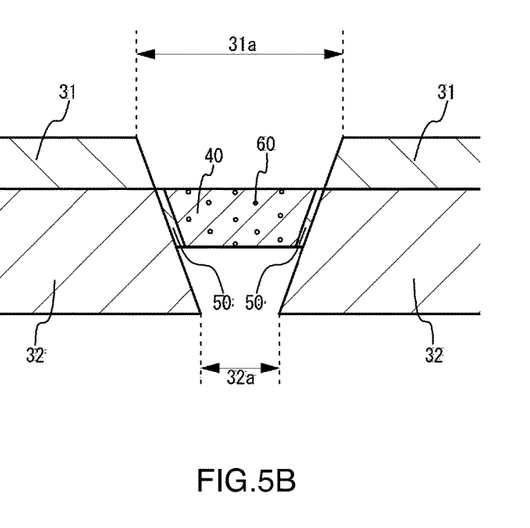
FIG. 5B is an enlarged cross-sectional view of a part enclosed by the dash-dot line in FIG. 5A.

The first through-hole 31a and the second through-hole 32a may be formed with an opening widening from the semiconductor laser element 10 side toward the opening of the cap 30 to outside (see FIGS. 3A and 3B). With this arrangement, light can be efficiently reflected toward outside of the cap 30 by the inclined inner wall surfaces which define the first through-hole 31a and the second through-hole 32a, and thus more stable optical characteristics can be maintained.

The cap 30 can be provided with a support member 33 which has a cylindrical shape and supports the outer periphery of the lower surface of the second member 32. The support member 33 is, for example, fixed on the stem 21. The support member 33 is preferably made of a metal in view of heat dissipation performance. The second member 32 and the support member 33 are fixed by using YAG laser welding or the like. A member such as a lens for concentrating light from the semiconductor laser element 10 may be disposed between the semiconductor laser element 10 and the through-hole 30a of the cap 30.

(Wavelength Converting Member 40)

The wavelength converting member 40 is disposed in the through-hole 30a of the cap 30 to emit light which has a wavelength different from light from the semiconductor laser element 10. For the wavelength converting member 40, for example, a sintered body, a light transmissive resin, or a glass, which contains a fluorescent material 60 to be excited by light from the semiconductor laser element 10 can be used. In this case, the fluorescent material 60 contained in the sintered body or the light transmissive resin is excited by the light from the semiconductor laser element 10 which is incident on the wavelength converting member 40, and from the excited fluorescent material 60, light with a wavelength different from that of the light from the semiconductor laser element 10 is emitted.

For the sintered body, for example, a ceramic of aluminum oxide ($Al_2O_3$), titanium oxide ($TiO_2$), zirconium oxide ($ZrO_2$), or the like, can be preferably used. With the use of ceramic, deformation or the like of the wavelength converting member 40 due to the heat generated by the fluorescent material 60 can be suppressed, so that stable optical characteristics can be obtained.

For the fluorescent material 60, for example, an yttrium aluminum garnet-based fluorescent material (a YAG-based fluorescent material), a lutetium aluminum garnet-based fluorescent material (a LAG-based fluorescent material), a terbium aluminum garnet-based fluorescent material (a TAG-based fluorescent material), a sialon-based fluorescent material, or the like, can be used singly or in combination.

The wavelength converting member 40 may contain, for example, particles of a light scattering material such as silicon oxide ($SiO_2$), aluminum oxide ($Al_2O_3$), zirconium oxide ($ZrO_2$), titanium oxide ($TiO_2$), or the like, which may be employed singly or in combination. With this arrangement, light from the semiconductor laser element 10 can be scattered in the wavelength converting member 40, so that unevenness of luminescent color in the light extracted from the light emitting device 100 can be suppressed.

The shape of the wavelength converting member 40 is not specifically limited and for example, a cylindrical shape, a quadrangular prism shape, a truncated cone shape, or the like, can be employed.

The wavelength converting member 40 is disposed on the second member 32. Examples of configurations with the wavelength converting member 40 disposed on the second member 32 include a configuration in which the wavelength converting member 40 is in contact with the second member 32 (see FIGS. 1A and 1B and FIGS. 3A and 3B), and a configuration in which the wavelength converting member 40 is in contact with the metal member 50 which is in contact with the second member 32 (see FIGS. 2A and 2B). With the wavelength converting member 40 being disposed on the second member 32, heat generated by the wavelength converting member 40 can be efficiently released to the outside of the cap 30 through the second member 32.

The wavelength converting member 40 may be in contact with the first member 31 (see FIGS. 1A, 1B and FIGS. 2A, 2B), or may not be in contact with the first member 31 (see FIGS. 3A, 3B). Examples of configurations with the wavelength converting member 40 being in contact with the first member 31 include a configuration in which the wavelength converting member 40 has a shape which matches the first through-hole 31a of the first member 31 (inclusive of a case of perfectly matching and a case of slight differences in the shapes which can be regarded as a shape error). In the case where forming of the wavelength converting member 40 which matches the first through-hole 31a is difficult to manufacture, the gap between the wavelength converting member 40 and the inner wall surfaces which define the first through-hole 31a may be filled with a light transmissive member. For example, the gap between the wavelength converting member 40 and the inner wall surfaces of the through-hole 31a is preferably filled with aluminum oxide ($Al_2O_3$), a light transmissive resin, or the like, by using sputtering, CVD, vapor deposition, atomic layer deposition method, sol-gel method, or the like. Particularly, atomic layer deposition method or sol-gel method is preferably used, with which, the gap between the wavelength converting member 40 and the inner wall surfaces of the through-hole 31a can be filled easily. With this arrangement, an improvement in the adhesion between the wavelength converting member 40 and the first member 31 can be achieved, which can increase the heat dissipation path, and thus the heat dissipation performance can be improved.

The inner wall surfaces defining the second through-hole 32a which penetrates the second member 32 may be provided with a third member 34 made of a ceramic. With this arrangement, light propagating from the lower surface of the wavelength converting member 40 toward the semiconductor laser element 10 side (e.g., light reflected at the lower surface of the wavelength converting member 40 or at the inner side of the wavelength converting member 40) can be reflected at the third member 34 made of a ceramic, and can be made incident again on the wavelength converting member 40. For the third member 34, with the aim to reflect light from the semiconductor laser element 10, a same member as for the first member 31 (a ceramic made of the same material) is preferably used.

In the case of disposing the third member 34 to the inner wall surfaces of the second member 32, an engaging portion X such as a step difference to engage the third member 34 to the inner wall surfaces of the second member 32 is preferably formed on the third member 34 and the inner wall surfaces of the second member 32. With this arrangement, positioning of the third member 34 at the inner wall surfaces of the second member 32 can be facilitated and the adhesion between the inner wall surfaces of the second member 32 and the third member 34 can be improved.

The third member 34 may be in contact with one or more inner wall surfaces of the second member 32.

As described above, in a light emitting device 100 according to Embodiment 1, a cap 30 includes a first member 31 made of a ceramic and a second member 32 made of a metal material. The through-hole 30a includes a first through-hole-31a penetrating the first member 31 and a second through-hole 32a penetrating the second member 32. The wavelength converting member 40 is disposed on the second member 32. Accordingly, a light emitting device of good stability in the optical characteristics and heat dissipation performance can be provided.

Light Emitting Device 200 According to Embodiment 2

As shown in FIGS. 4A, 4B and FIGS. 5A, 5B, a light emitting device 200 according to Embodiment 2 differs from the light emitting device 100 according to Embodiment 1 in that, in the light emitting device 200, side surfaces of the wavelength converting member 40 are disposed on the second member 32, while in the light emitting device 100, the lower surface of the wavelength converting member 40 is disposed on the second member 32. According to Embodiment 2, as in Embodiment 1, a light emitting device with good stability in its optical characteristics and good heat dissipation performance can be provided.

As shown in FIGS. 4A, 4B and FIGS. 5A, 5B, the wavelength converting member 40 may have a shape which matches the second through-hole 32a of the second member 32 (inclusive of a case of perfectly matching and a case of slight differences in the shapes which can be regarded as a shape error). With this arrangement, the side surfaces of the wavelength converting member 40 can be easily disposed on the second member 32. In the case where forming of the wavelength converting member 40 which matches the second through-hole 32a is difficult to manufacture, the gap between the side surfaces of the wavelength converting member 40 and the inner wall surfaces which define the second through-hole 32a may be filled with a light transmissive member. For example, the gap between the side surfaces of the wavelength converting member 40 and the inner wall surfaces of the through-hole 32a is preferably filled with aluminum oxide ($Al_2O_3$), a light transmissive resin, or the like, by using sputtering, CVD, vapor deposition, atomic layer deposition method, sol-gel method, or the like. Particularly, atomic layer deposition method or sol-gel method is preferably used, with which, the gap can be filled easily. With this arrangement, an improvement in the adhesion between the side surfaces of the wavelength converting member 40 and the second member 32 can be achieved, which can increase the heat dissipation path, and thus the heat dissipation performance can be improved.

Figure 7A:
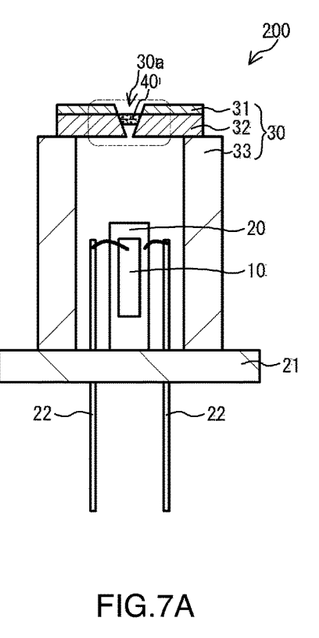
Figure 7B:
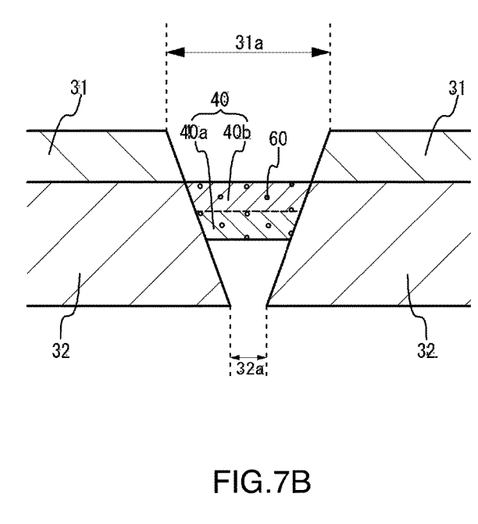
FIG. 7B is an enlarged cross-sectional view of a part enclosed by the dash-dot line in FIG. 7A.

The wavelength converting member 40 may have a multilayer structure, and for example as shown in FIGS. 7A, 7B, a configuration in which a wavelength converting member 40a made of a sintered body and a wavelength converting member 40b made of a glass are disposed in this order from the semiconductor laser element 10 side can be employed. In this case, with the aim to adjust light emitted from the light emitting device 200 to a desired color tone, a fluorescent material 60, for example, a red fluorescent material, may be contained in the wavelength converting member 40b made of a glass. With this arrangement, the color tone of the light emitting device 200 can be adjusted while maintaining heat dissipation performance of the light emitting device 200. In FIGS. 7A, 7B, as an example, a configuration of a light emitting device according to Embodiment 2 in which the wavelength converting member 40 has a multilayer structure is illustrated, but the wavelength converting member 40 with a multilayer structure is not limited to Embodiment 2, and a wavelength converting member 40 with a multilayer structure can be employed in Embodiment 1 and/or other embodiments.

Embodiments have been described above, but they are merely examples, and the configurations recited in any claim shall not be limited by those descriptions.

What is claimed is:
1. A light emitting device comprising:
    a plate-shaped stem;
    a heat sink fixed on the plate-shaped stem;
    a semiconductor laser element disposed on the heat sink;
    a plurality of leads, each of which is connected to the semiconductor laser element via an electrically conductive member;
    a cap comprising:
        a first member comprising a ceramic,
        a second member comprising a metal material, and
        a support member fixed on the plate-shaped stem, the support member having a cylindrical shape,
        wherein the second member is supported by the support member at an outer periphery of a lower surface of the second member, and the first member is supported by the second member, such that the semiconductor laser element is located closer to the second member than to the first member, and
        wherein a first through-hole penetrates the first member, and a second through-hole penetrates the second member, each of the first and second through-holes having an opening that widens in a direction away from the semiconductor laser element, wherein an inner wall surface of the first member that defines the first through-hole is flush with an inner wall surface of the second member defining the second through-hole; and
    a multilayered wavelength converting member comprising:
        a first wavelength converting layer comprising a sintered body, and
        a second wavelength converting layer comprising glass,
        wherein both of the first and second wavelength converting layers comprise a fluorescent material,
        wherein both of the first and second wavelength converting layers are disposed in the second through-hole and are supported by the second member at a location below the first through-hole, and
        wherein the semiconductor laser element is located closer to the first wavelength converting layer than to the second wavelength converting layer.
2. The light emitting device according to claim 1, wherein the wavelength converting member is supported by the second member via a metal member.
3. The light emitting device according to claim 2, wherein the second through-hole has a top side opening diameter that is smaller than a top side opening diameter of the first through-hole, and
    wherein a lateral surface of the wavelength converting member is in contact with the metal member, which is in contact with the second member.
4. The light emitting device according to claim 2, wherein lateral surfaces of both the first and second wavelength converting layers are in contact with the metal member, which is in contact with the second member.
5. The light emitting device according to claim 3, wherein a third member comprising a ceramic is disposed on the inner wall surface of the second member that defines the second through-hole.
6. The light emitting device according to claim 5, wherein the ceramic of the first member has a reflectance of 70% or greater to light from the semiconductor laser element.
7. The light emitting device according to claim 5, wherein the third member is made of a same material as the first member.
8. The light emitting device according to claim 1, wherein the second through-hole has a top side opening diameter that is smaller than a top side opening diameter of the first through-hole, and
    wherein a lateral surface of the wavelength converting member is in contact with the second member.
9. The light emitting device according to claim 8, wherein a third member comprising a ceramic is disposed on the inner wall surface of the first member that defines the second through-hole.
10. The light emitting device according to claim 9, wherein the ceramic of the first member has a reflectance of 70% or greater to light from the semiconductor laser element.
11. The light emitting device according to claim 9, wherein the third member is made of a same material as the first member.
12. The light emitting device according to claim 1, wherein the ceramic of the first member has a reflectance of 70% or greater to light from the semiconductor laser element.
13. The light emitting device according to claim 1, wherein the metal material has a thermal conductivity of 100 W·m−1·K−1 or greater.
14. The light emitting device according to claim 1, wherein an entirety of the second wavelength converting layer is located above an entirety of the first wavelength converting layer.
15. The light emitting device according to claim 14, wherein an entirety of a lowermost surface of the second wavelength converting layer is in contact with an entirety of an uppermost surface of the first wavelength converting layer.
16. The light emitting device according to claim 14, wherein an upper surface of the second wavelength converting layer is exposed to an open space above the second wavelength converting layer, and wherein a lower surface of the first wavelength converting layer is exposed to a space below the first wavelength converting layer that is enclosed by the stem and the cap.

17. The light emitting device according to claim 15,
wherein an upper surface of the second wavelength converting layer is exposed to an open space above the second wavelength converting layer, and
wherein a lower surface of the first wavelength converting layer is exposed to a space below the first wavelength converting layer that is enclosed by the stem and the cap.

18. The light emitting device according to claim 1, wherein an upper surface of the second wavelength converting layer is exposed to an open space above the second wavelength converting layer.

19. The light emitting device according to claim 1, wherein a lower surface of the first wavelength converting layer is exposed to a space below the first wavelength converting layer that is enclosed by the stem and the cap.

20. The light emitting device according to claim 1,
wherein an upper surface of the second wavelength converting layer is exposed to an open space above the second wavelength converting layer, and
wherein a lower surface of the first wavelength converting layer is exposed to a space below the first wavelength converting layer that is enclosed by the stem and the cap.

21. The light emitting device according to claim 1,
wherein lateral surfaces of both the first and second wavelength converting layers are in contact with the second member.

* * * * *